(12) United States Patent
Hyun et al.

(10) Patent No.: US 11,217,192 B2
(45) Date of Patent: Jan. 4, 2022

(54) DISPLAY DEVICE

(71) Applicant: Samsung Display Co., Ltd., Yongin-si (KR)

(72) Inventors: Chang Ho Hyun, Yongin-si (KR); Hee Kwon Eun, Yongin-si (KR); Man Bok Cheon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/678,377

(22) Filed: Nov. 8, 2019

(65) Prior Publication Data

US 2020/0211490 A1 Jul. 2, 2020

(30) Foreign Application Priority Data

Dec. 28, 2018 (KR) .......................... 10-2018-0172884

(51) Int. Cl.
*G09G 3/36* (2006.01)
*G02F 1/1343* (2006.01)
*G02F 1/13357* (2006.01)
*H01L 27/32* (2006.01)

(52) U.S. Cl.
CPC ..... *G09G 3/3648* (2013.01); *G02F 1/134336* (2013.01); *G02F 1/133603* (2013.01); *G02F 2203/22* (2013.01); *G09G 2300/0426* (2013.01); *G09G 2300/0478* (2013.01); *G09G 2320/0626* (2013.01); *H01L 27/3232* (2013.01)

(58) Field of Classification Search
CPC .......... G09G 3/3648; G09G 2300/0478; G02F 1/133603
See application file for complete search history.

(56) References Cited

U.S. PATENT DOCUMENTS

| | | | | |
|---|---|---|---|---|
| 2013/0162616 A1* | 6/2013 | Park | .................... | G09G 3/3648 345/211 |
| 2014/0168038 A1* | 6/2014 | Kim | .................... | G09G 3/3233 345/82 |
| 2016/0351144 A1* | 12/2016 | Park | .................... | G09G 3/3648 |
| 2018/0025692 A1* | 1/2018 | Yata | .................... | G09G 3/3648 345/694 |

FOREIGN PATENT DOCUMENTS

| KR | 10-2018-0017591 A | 2/2018 |
|---|---|---|
| KR | 10-2018-0025472 A | 3/2018 |

\* cited by examiner

*Primary Examiner* — Kent W Chang
*Assistant Examiner* — Chayce R Bibbee
(74) *Attorney, Agent, or Firm* — Lewis Roca Rothgerber Christie LLP

(57) ABSTRACT

A display device includes a display panel including display pixels, and a display filter overlapping the display panel and including filter pixels that are greater in number than the display pixels, wherein in units of frame, each of the display pixels is configured to emit light at a luminance corresponding to one gray level, and wherein in units of sub-frames, each of the filter pixels is configured to be switched to a transmissive state or a non-transmissive state, wherein each of the sub-frames is shorter in period than a corresponding one of the frames.

9 Claims, 14 Drawing Sheets

<RELATED ART>

<RELATED ART>

DISPLAY DEVICE

CROSS-REFERENCE TO RELATED APPLICATION

The application claims priority to and the benefit of Korean Patent Application No. 10-2018-0172884, filed Dec. 28, 2018, the entire content of which is hereby incorporated by reference for all purposes as if fully set forth herein.

BACKGROUND

1. Field

One or more aspects of embodiments of the present disclosure are directed toward a display device.

2. Discussion

With the development of information technology, the importance of display devices that provide a connection medium between users and information has been emphasized. In response to this, the use of display devices such as a liquid crystal display device, an organic light emitting display device, and/or a plasma display device has been increasing.

The distance between the user's eyes and a display panel in a head mounted display (HMD) worn by the user is closer than in other display devices. Therefore, there is a problem that a non-light emitting area, in which display pixels are not present in the display panel, can be visually recognized as a black net by the user's eyes.

SUMMARY

One or more aspects of embodiments of the present disclosure are directed toward a display device capable of preventing or reducing a non-light emitting area of a display panel from being visually recognized and preventing or reducing a moiré phenomenon.

According to one example embodiment, a display device may include: a display panel including display pixels; and a display filter overlapping the display panel and including filter pixels, wherein the filter pixels are greater in number than the display pixels, wherein in units of frames, each of the display pixels may be configured to emit light at a luminance corresponding to one gray level, wherein in units of sub-frames, each of the filter pixels may be configured to be switched to a transmissive state or a non-transmissive state, and wherein each of the sub-frames is shorter in period than a corresponding one of the frames.

Each of the filter pixels may be smaller in area than a corresponding one of the display pixels.

Each of the filter pixels may comprise: a liquid crystal capacitor having an electrode connected to a first common electrode and another electrode connected to a first node; and a first transistor having a gate electrode connected to a first filter line, an electrode connected to a second common electrode, and another electrode connected to the first node.

A first DC voltage may be supplied to the first common electrode during each of the frames, and a second DC voltage having a magnitude different from that of the first DC voltage may be supplied to the second common electrode during each of the frames.

Each of the filter pixels may further comprise: a second transistor having a gate electrode connected to a second filter line, an electrode connected to a third common electrode, and another electrode connected to the first node.

A third DC voltage having a magnitude different from that of the second DC voltage may be supplied to the third common electrode during each of the frames.

Voltages of different magnitudes may be supplied to the first filter line and the second filter line during each of the frames.

In units of sub-frames, the voltages of the different magnitudes may be alternately supplied to the first filter line and the second filter line.

The display filter may comprise: a liquid crystal layer; a first substrate between the liquid crystal layer and the display panel; and a second substrate on the first substrate and the liquid crystal layer.

An interval between the filter pixels in the transmissive state may be set based on a thickness of the first substrate, a refractive index of the first substrate, an interval between the display pixels, and a target wavelength.

The interval (pch_f) between the filter pixels in the transmissive state may be set to satisfy Equation 1 as follows:

$$\text{pch\_f} = \frac{WL}{GN} \times \frac{1}{\sin\left(\tan^{-1}\frac{\text{pch\_p}}{2GT}\right)}, \quad \text{Equation 1}$$

wherein GT is a thickness of the first substrate, GN is a refractive index of the first substrate, pch_p is an interval between the display pixels, and WL is a target wavelength.

A first group of the filter pixels and a second group of the filter pixels may overlap a corresponding one of the display pixels, and when the first group of the filter pixels is in the transmissive state, the second group of the filter pixels may be in the non-transmissive state.

When the first group of the filter pixels is in the non-transmissive state, the second group of the filter pixels may be in the transmissive state.

BRIEF DESCRIPTION OF THE DRAWINGS

The accompanying drawings, which are included to provide a further understanding of the inventive concepts, and are incorporated in and constitute a part of this specification, illustrate example embodiments of the inventive concepts, and, together with the description, serve to explain principles of the inventive concepts.

DETAILED DESCRIPTION

Figure 1:
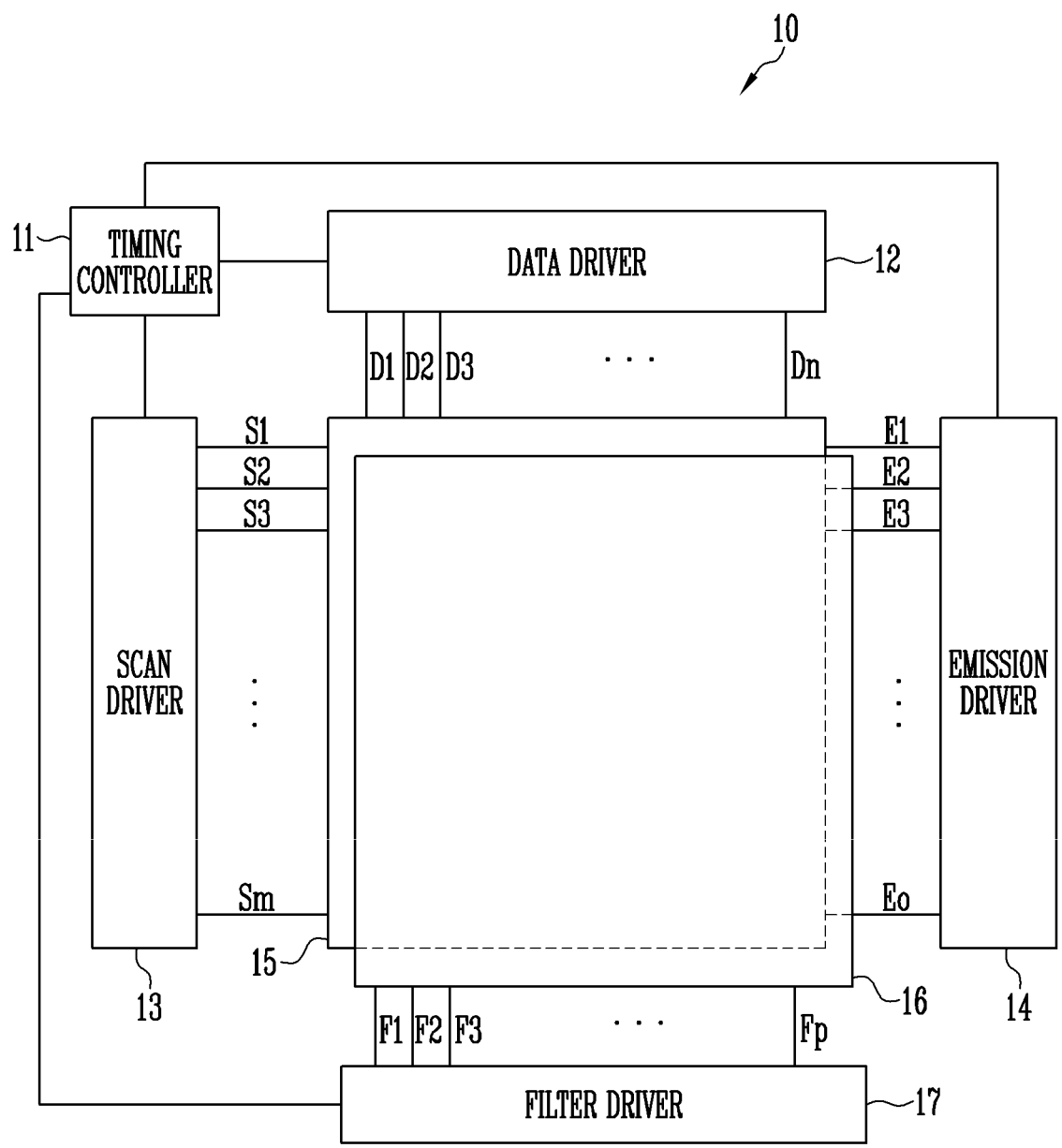
FIG. 1 is a block diagram for explaining a display device according to an embodiment of the invention.

Hereinafter, embodiments of the invention will be described in more detail with reference to the accompanying drawings. The following embodiments are provided so that those skilled in the art will be able to fully understand the invention. The embodiments can be modified in various ways. The scope of the invention is not limited to the embodiments described below.

In order to clearly illustrate the invention, parts (e.g., elements) that are not related to the description are not provided, and the same or similar components are denoted by the same reference numerals throughout the specification and drawings. Therefore, the reference numerals can be used in one or more drawings.

In addition, the size and thickness of each component shown in the drawings are arbitrarily shown for convenience of explanation, and thus the invention is not necessarily limited to those shown in the drawings. In the drawings, thicknesses may be exaggerated for clarity of presentation of layers and/or regions.

FIG. 1 is a block diagram for explaining a display device according to an embodiment of the invention.

Referring to FIG. 1, a display device 10 according to an embodiment of the invention may include a timing controller 11, a data driver 12, a scan driver 13, a emission driver 14, a display panel 15, a display filter 16, and a filter driver 17.

The timing controller 11 may provide the data driver 12 with grayscale values (gray level values), a clock signal, a control signal, and/or the like. In addition, the timing controller 11 may provide a clock signal, a control signal, and/or the like to each of the scan driver 13, the emission driver 14, and the filter driver 17.

The data driver 12 may generate data signals to be provided to data lines D1, D2, D3, . . . , Dn by using the grayscale values and the control signals received from the timing controller 11. For example, the data driver 12 may sample the grayscale values using the clock signal and supply the data signals corresponding to the grayscale values to the data lines D1 to Dn on a display pixel row basis, where n may be a natural number.

The scan driver 13 may receive the clock signal, the control signal and/or the like from the timing controller 11 to generate scan signals to be supplied to scan lines S1, S2, S3, . . . , Sm. For example, the scan driver 13 may sequentially supply the scan signals having pulses of a turn-on level to the scan lines S1 to Sm. For example, the scan driver 13 may generate the scan signals in a manner that sequentially transmits the pulses of the turn-on level to a next stage circuit in accordance with the clock signal, where n may be a natural number. For example, the scan driver 13 may be configured in the form of a shift register.

The emission driver 14 may receive the clock signal, the control signal and/or the like from the timing controller 11 to generate emission signals to be supplied to emission lines E1, E2, E3, . . . , Eo. For example, the emission driver 14 may sequentially supply the emission signals having pulses of a turn-off level to the emission lines E1 to Eo. In another example, the emission driver 14 may sequentially supply the light emitting signals having pulses of a turn-on level to the emission lines E1 to Eo, where o may be a natural number. For example, the emission driver 14 may generate the emission signals in a manner that the pulse of the turn-off level or the pulse of the turn-on level is sequentially transmitted to a next stage circuit in accordance with the clock signal. For example, the emission driver 14 may be configured in the form of a shift register.

The display panel 15 may include display pixels. Each of the display pixels may be connected to a data line, a scan line, and an emission line corresponding thereto. Each of the display pixels may store a data signal of the data line when a scan signal of a turn-on level is supplied to the scan line. In addition, each of the display pixels may emit light with a luminance corresponding to a gray level of the stored data signal when an emission signal of a turn-on level is supplied to the emission line. At this time, each of the display pixels may emit light with a luminance corresponding to one grayscale level in one frame unit.

The display filter 16 may be disposed (e.g., positioned) to overlap the display panel 15 and may include a larger number of filter pixels than display pixels. In some embodiments, each of the filter pixels may be switched to a transmissive state or a non-transmissive state in units of sub-frames each being shorter in period than that of a corresponding frame.

The filter driver 17 may receive control signals and/or the like from the timing controller 11 and generate filter signals to be supplied to filter lines F1, F2, F3, . . . , Fp, where p may be a natural number. For example, the filter driver 17 may alternately supply voltages of different magnitudes to first and second groups of the filter lines based on a sub-frame basis. For example, the filter driver 17 may supply a high logic level voltage to the first group of the filter lines and a low logic level voltage to the second group of the filter lines in a first sub-frame. Next, the filter driver 17 may supply the low logic level voltage to the first group of the filter lines and the high logic level voltage to the second group of the filter lines in a second sub-frame. Next, the filter driver 17 may supply the high logic level voltage to the first group of the filter lines and the low logic level voltage to the second group of the filter lines in a third sub-frame.

In one embodiment, the first group of the filter lines may be odd-numbered filter lines and the second group of the filter lines may be even-numbered filter lines. In another embodiment, the first group of the filter lines may be even-numbered filter lines and the second group of the filter lines may be odd-numbered filter lines, but the embodiments of the present invention are not limited thereto. The filter pixels are controlled by the filter signals applied to the filter lines so that each of the filter pixels can be switched to a transmissive state or a non-transmissive state in units of sub-frames each being shorter in period than a corresponding one of the frames.

Although FIG. 1 shows the filter lines F1, F2, F3, . . . , Fp for convenience as extending in a direction orthogonal (or crossing) to the scan lines S1, S2, S3, . . . , Sm, the extending directions of the filter lines F1, F2, F3, . . . , Fp and the extending directions of the scan lines S1, S2, S3, . . . , Sm may be independent of each other. Thus, in one embodiment, the filter lines F1, F2, F3, . . . , Fp may extend in the same direction as the scan lines S1, S2, S3, . . . , Sm.

Figure 2:
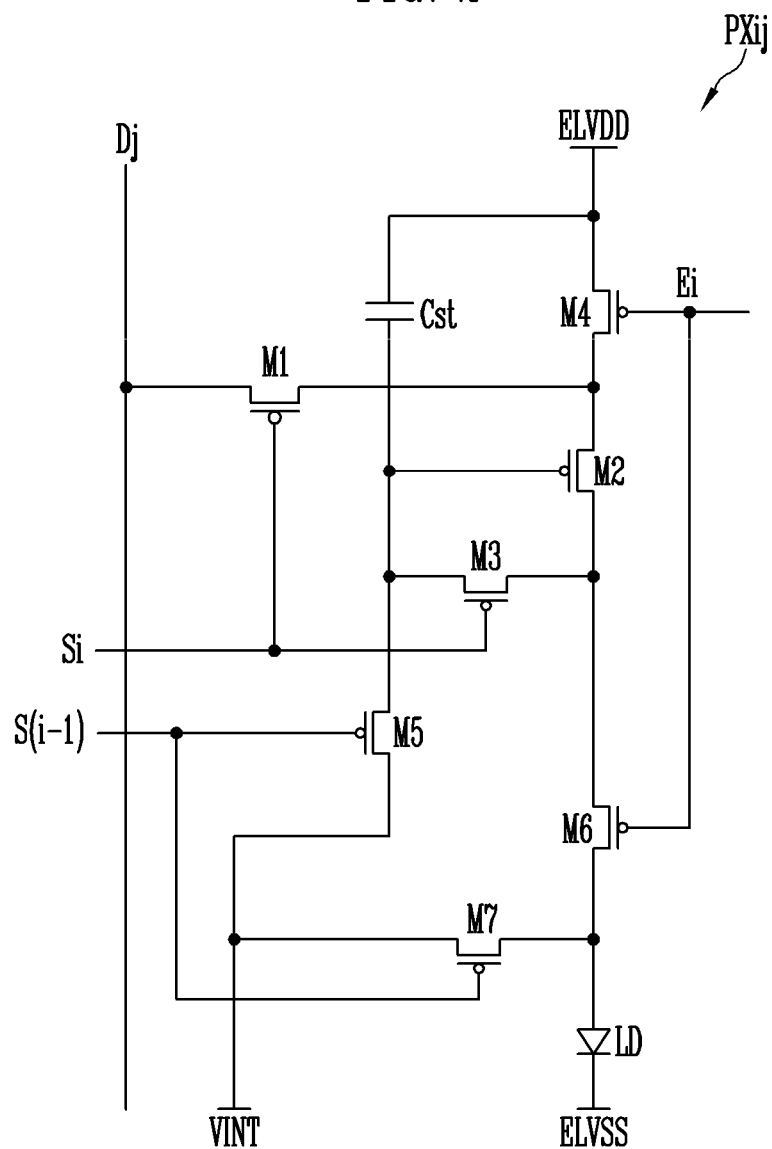
FIG. 2 is a circuit diagram for explaining a display pixel according to an embodiment of the invention.

FIG. 2 is a circuit diagram for explaining a display pixel according to an embodiment of the invention.

Referring to FIG. 2, a display pixel PXij according to an embodiment of the invention may include transistors M1 to M7, a storage capacitor Cst, and a light emitting diode LD.

In one embodiment, the transistors M1 to M7 may be P-type transistors (for example, PMOS). However, those skilled in the art will be able to constitute (obtain) display pixels that perform the same (or substantially the same) function by replacing at least some of the transistors M1 to M7 with N-type transistors (e.g., NMOS).

The first transistor M1 may have a gate electrode connected to a scan line Si, one electrode connected to a data line Dj, and the other electrode connected to one electrode of the second transistor M2. The first transistor M1 may be referred to as a scan transistor, a switching transistor, and/or the like.

The storage capacitor Cst may have one electrode connected to a first power supply line ELVDD and the other electrode connected to a gate electrode of the second transistor M2.

The second transistor M2 may have a gate electrode connected to the other electrode of the storage capacitor Cst, one electrode connected to the other electrode of the first transistor M1, and the other electrode connected to the other electrode of the third transistor M3. The second transistor M2 may be referred to as a driving transistor.

The third transistor M3 may have a gate electrode connected to the scan line Si, one electrode connected to the gate electrode of the second transistor M2, and the other electrode connected to the other electrode of the second transistor M2. The third transistor M3 may be referred to as a diode-connected transistor.

The fourth transistor M4 may have a gate electrode connected to a emission line Ei, one electrode connected to the first power supply line ELVDD, and the other electrode connected to one electrode of the second transistor M2. The fourth transistor M4 may be referred to as an emission control transistor.

The fifth transistor M5 may have a gate electrode connected to a scan line S(i−1), one electrode connected to the gate electrode of the second transistor M2, and the other electrode connected to an initialization power supply line VINT. The fifth transistor M5 may be referred to as a gate initializing transistor.

The sixth transistor M6 may have a gate electrode connected to the emission line Ei, one electrode connected to the other electrode of the second transistor M2, and the other electrode connected to an anode of the light emitting diode LD. The sixth transistor M6 may be referred to as an emission control transistor.

The light emitting diode LD may have the anode connected to the other electrode of the sixth transistor M6, and a cathode connected to a second power supply line ELVSS. For example, the light emitting diode LD may be an organic light emitting diode or an inorganic light emitting diode.

The seventh transistor M7 may have a gate electrode connected to the scan line S(i−1), one electrode connected to the initialization power supply line VINT and the other electrode connected to the anode of the light emitting diode LD. The seventh transistor M7 may be referred to as an anode initializing transistor. In another embodiment, the gate electrode of the seventh transistor M7 may be connected to another scan line.

Figure 3:
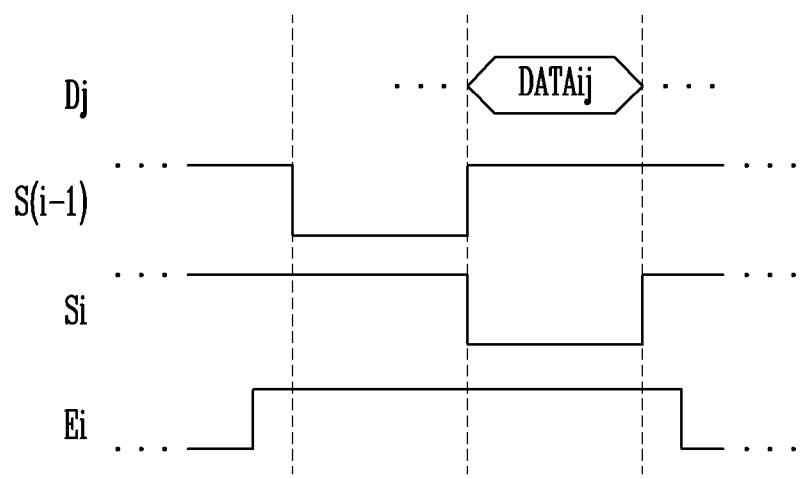
FIG. 3 is a timing chart for explaining an example driving method of the display pixel of FIG. 2.

FIG. 3 is a timing chart for explaining an example driving method of the display pixel of FIG. 2.

First, when a scan pulse of a turn-on level is supplied to the scan line S(i−1), the transistors M5 and M7 may be turned on. Hereinafter, a pulse of a turn-on level may refer to a pulse having a voltage level capable of turning on a transistor to which a corresponding pulse is supplied. In this embodiment, the transistors M1 to M7 may be P-type transistors, and thus they can be turned on at a low level voltage and can be turned off at a high level voltage. When the fifth transistor M5 is turned on, the gate electrode of the second transistor M2 is connected to the initialization voltage line VINT, and a voltage accumulated in the gate electrode of the second transistor M2 may be initialized. In addition, when the seventh transistor M7 is turned on, the anode of the light emitting diode LD is connected to the initialization voltage line VINT, and the light emitting diode LD may be initialized by being discharged or precharged. The initialization voltage supplied to the initialization voltage line VINT may be equivalent to a second voltage supplied to the second power supply line ELVSS. The second voltage may have a lower voltage level than a first voltage supplied to the first power supply line ELVDD.

Next, when a scan pulse of a turn-on level is supplied to the scan line Si, the transistors M1 and M3 may be turned on. At this time, the second transistor M2 whose voltage of the gate electrode is initialized may be turned on. Therefore, a data signal supplied to the data line Dj may be transferred to the other electrode of the storage capacitor Cst via the first transistor M1, the second transistor M2, and the third transistor M3. At this time, the voltage of the data signal supplied to the other electrode of the storage capacitor Cst may be reduced by a threshold voltage of the second transistor M2.

Thereafter, when the emission signal of a turn-on level is supplied to the emission line Ei, the transistors M4 and M6 may be turned on and a driving current path may be formed through the first power supply line ELVDD, the fourth transistor M4, the second transistor M2, the sixth transistor M6, the light emitting diode LD, and the second power supply line ELVSS. The light emitting diode LD may emit light with a luminance corresponding to the amount of a driving current flowing along the driving current path. The amount of the driving current may depend on a voltage level of the data signal supported by the other electrode of the storage capacitor Cst. At this time, since the driving current flows through the second transistor M2, the threshold voltage reduction reflected in the data signal at the other electrode of the storage capacitor Cst can be mitigated or canceled. Therefore, according to the display pixel PXij of this embodiment, the driving current can flow irrespective of the process variation with respect to the threshold voltage of the second transistor M2.

Figure 4:
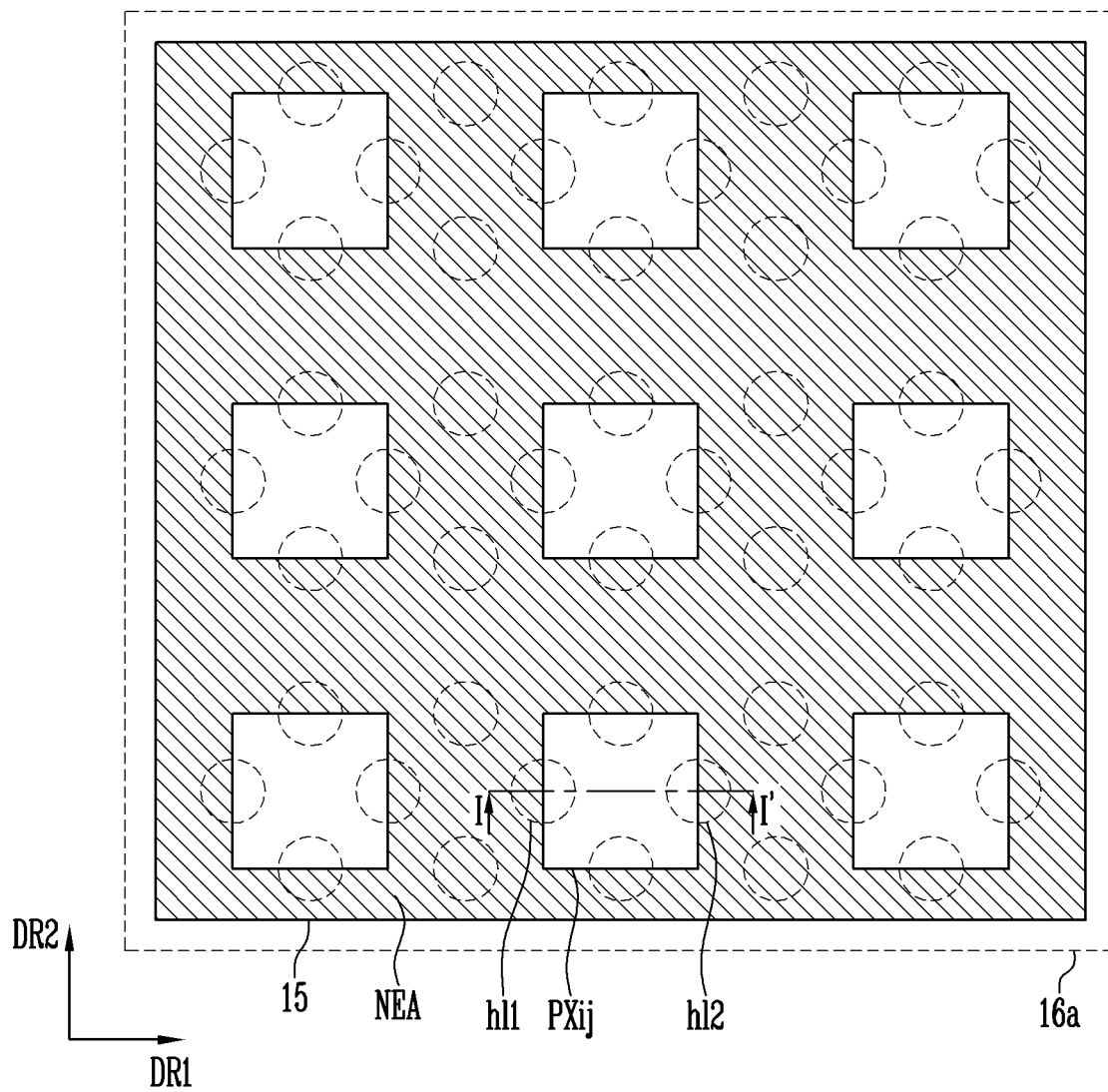
FIGS. 4 and 5 are diagrams for explaining a display filter according to the related art.
Figure 5:
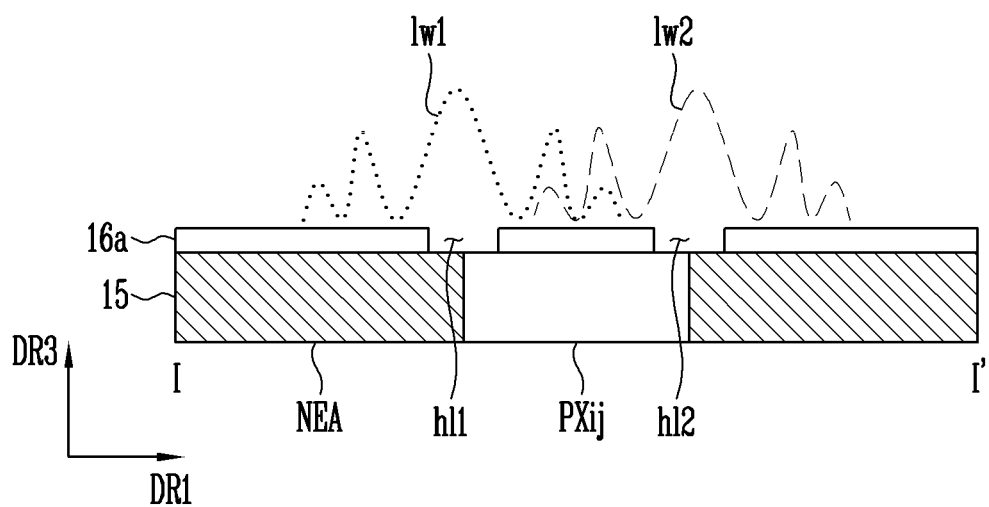

FIGS. 4 and 5 are diagrams for explaining a display filter according to the related art.

FIG. 4 is a plan view showing a part of the display panel 15 and a part of a related art display filter 16a, with reference to a first direction DR1 and a second direction DR2. FIG. 5 is a cross-sectional view of the part of the display panel 15 and the part of the display filter 16a taken along line I-I' in FIG. 4. The first direction DR1, the second direction DR2, and a third direction DR3 may be orthogonal to each other (or crossed).

The display panel 15 may include a plurality of display pixels including the display pixel PXij. Here, the position of each of the display pixels may correspond to the position of the light emitting diode LD of each of the display pixels. A portion where the display pixels are not present in the display panel 15 may correspond to a non-light emitting area NEA. For example, the display panel 15 may include a pixel defining layer that defines the position of the light emitting diode LD, and a portion of the pixel defining layer where the light emitting diode LD is not located may be the non-light emitting area NEA.

The positions of the display pixels shown in FIG. 4 are example, and embodiments of the present disclosure are not limited thereto. The display pixels may be arranged in various suitable ways such as a stripe structure, a pentile structure, an S-stripe structure, and/or the like.

The display filter 16a may include a plurality of holes including a hole hl1 and a hole hl2. The plurality of holes hl1 and hl2 may be respectively arranged at regular intervals with respect to each of the first direction DR1 and the second direction DR2. For example, the display filter 16a may be composed of an inorganic film and/or an organic film, and the plurality of holes may be formed by etching the inorganic film and/or the organic film.

For example, when the display pixel PXij emits light, diffracted light waves lw1 may be emitted through the hole hl1, and diffracted light waves lw2 may be emitted through the hole hl2. Referring to FIG. 5, for example, intensities of the diffracted light waves lw1 and lw2 are shown in the third direction DR3 based on the coordinates of the first direction DR1. Therefore, when the related art display device includes the display filter 16a, an image can be displayed on a portion corresponding to the non-light emitting area NEA, where the display pixel PXij does not exist, and a black net shape due to the non-light emitting area NEA may not be visible to the user.

However, when the holes hl1, hl2, . . . are of a fixed shape as shown in FIGS. 4 and 5, the moiré phenomenon may occur when the display pixels display an image of a specific pattern. That is, when the image of a specific pattern is displayed, a moiré pattern of the stripe shape may be visually recognized by the user, while diffracted light emitted from adjacent display pixels may cause constructive interference and destructive interference. This problem cannot be solved in the embodiments of FIGS. 4 and 5 in which the relative positions of the display pixels and the holes hl1, hl2, . . . are fixed.

Figure 6:
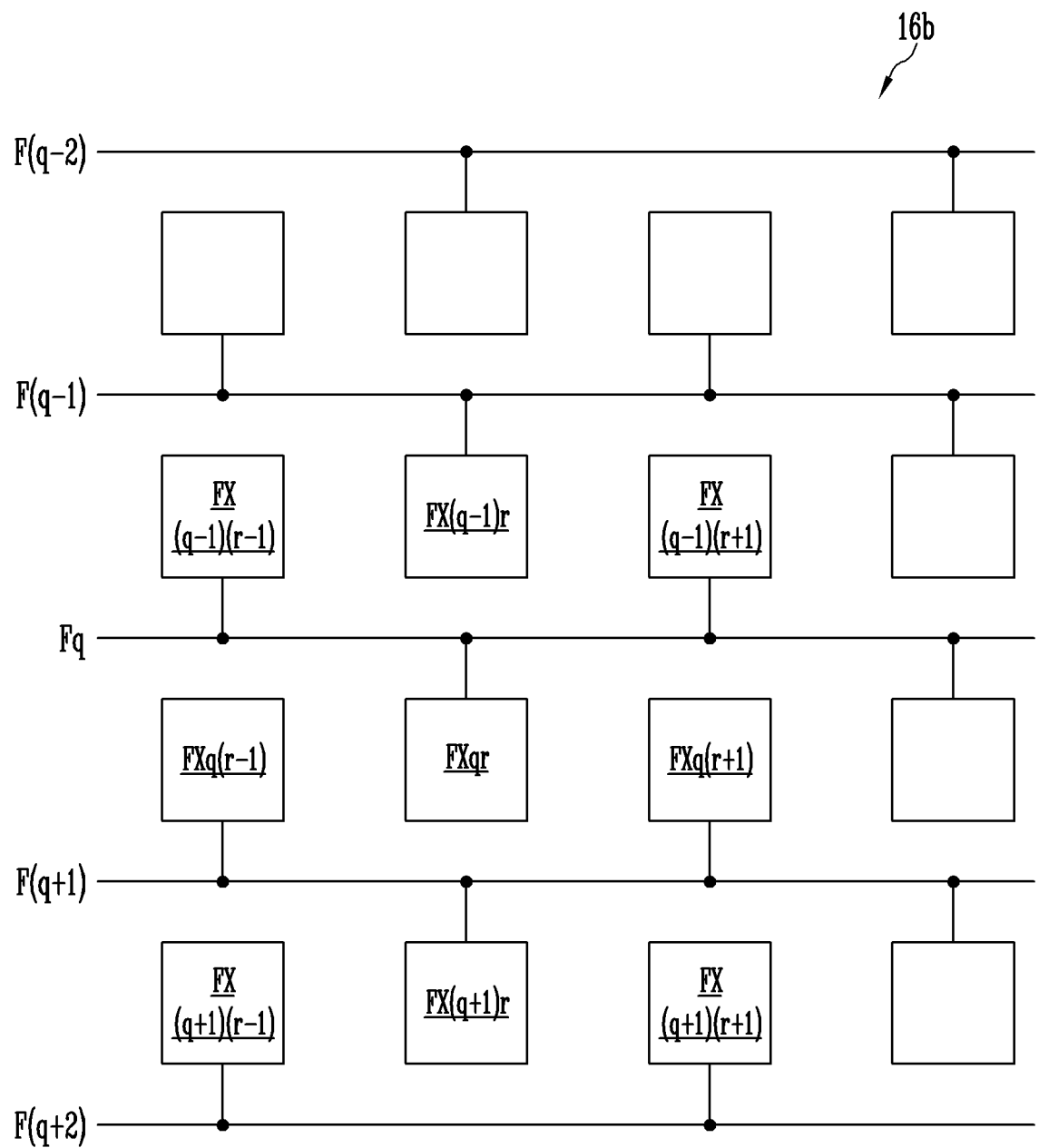
FIG. 6 is a diagram for explaining a display filter according to an embodiment of the invention.
Figure 7:
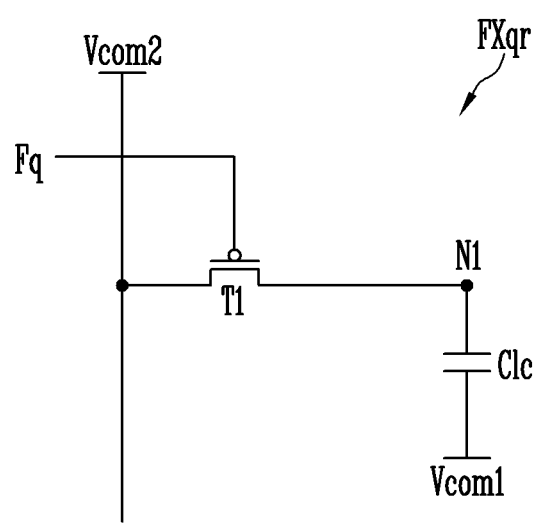
FIG. 7 is a circuit diagram for explaining a filter pixel according to an embodiment of the invention.

FIG. 6 is a diagram for explaining a display filter according to an embodiment of the present invention. FIG. 7 is a circuit diagram for explaining a filter pixel according to an embodiment of the present invention.

Referring to FIG. 6, a display filter 16b may include filter lines F(q−2) to F(q+2) and filter pixels FX(q−1)(r−1) to FX(q+1)(r+1), where q and r may be natural numbers.

In this embodiment, at least some of the filter pixels located in the same row may be connected to different filter lines. For example, although filter pixels FXq(r−1), FXqr and FXq(r+1) are located in the same q-th row, the filter pixel FXqr may be connected to a filter line Fq and the filter pixels FXq(r−1) and FXq(r+1) may be connected to a filter line F(q+1).

Referring to FIG. 7, the filter pixel FXqr may include a first transistor T1 and a liquid crystal capacitor Clc.

The liquid crystal capacitor Clc may have one electrode connected to a first common electrode Vcom1 and the other electrode connected to a first node N1. A dielectric layer of the liquid crystal capacitor Clc may be a liquid crystal layer.

The first transistor T1 may have a gate electrode connected to the first filter line Fq, one electrode connected to a second common electrode Vcom2, and the other electrode connected to the first node N1.

The first common electrode Vcom1 and the second common electrode Vcom2 may be commonly provided to filter pixels. A first DC voltage may be supplied to the first common electrode Vcom1 during each of a plurality of frames including one frame and a second DC voltage may also be supplied to the second common electrode Vcom2 during each of a plurality of frames. In another embodiment, the first DC voltage and the second DC voltage may be different from each other.

In one embodiment, when the first transistor T1 is turned off and the first node N1 is in a floating state, the characteristic of the liquid crystal capacitor Clc may be set such that the filter pixel FXqr is in a non-transmissive state. In this case, the filter pixel FXqr may be implemented as a normally black type (e.g., black filter pixel).

The filter pixel FXqr may be in a transmissive state when the first transistor TI is turned on and an electric field is formed according to the voltage difference between both ends of the liquid crystal capacitor Clc.

In another embodiment, when the first transistor T1 is turned off and the first node N1 is in a floating state, the characteristic of the liquid crystal capacitor Clc may be set such that the filter pixel FXqr is in a transmissive state. In this case, the filter pixel FXqr may be implemented as a normally white type (e.g., a white filter pixel).

The filter pixel FXqr may be in a non-transmissive state when the first transistor TI is turned on and an electric field formed according to the voltage difference between both ends of the liquid crystal capacitor Clc.

The characteristic of the liquid crystal capacitor Clc may be set by (e.g., may depend on) a kind (or type) of the liquid crystal molecules, an interfacial alignment of the liquid crystal molecules (for example, a pre-tilt angle with the substrate), a polarization axis direction of at least one polarizing film, a physical positional relationship between a constituent electrode of the first node N1 and the first common electrode Vcom1, and/or the like.

For example, the characteristics of the liquid crystal capacitor Clc may be set by various suitable modes such as IPS (In-Plane Switching) mode, FFS (Fringe Field Switch) mode, TN (Twisted Nematic) mode, and/or VA (Vertical Alignment) mode.

Figure 8:
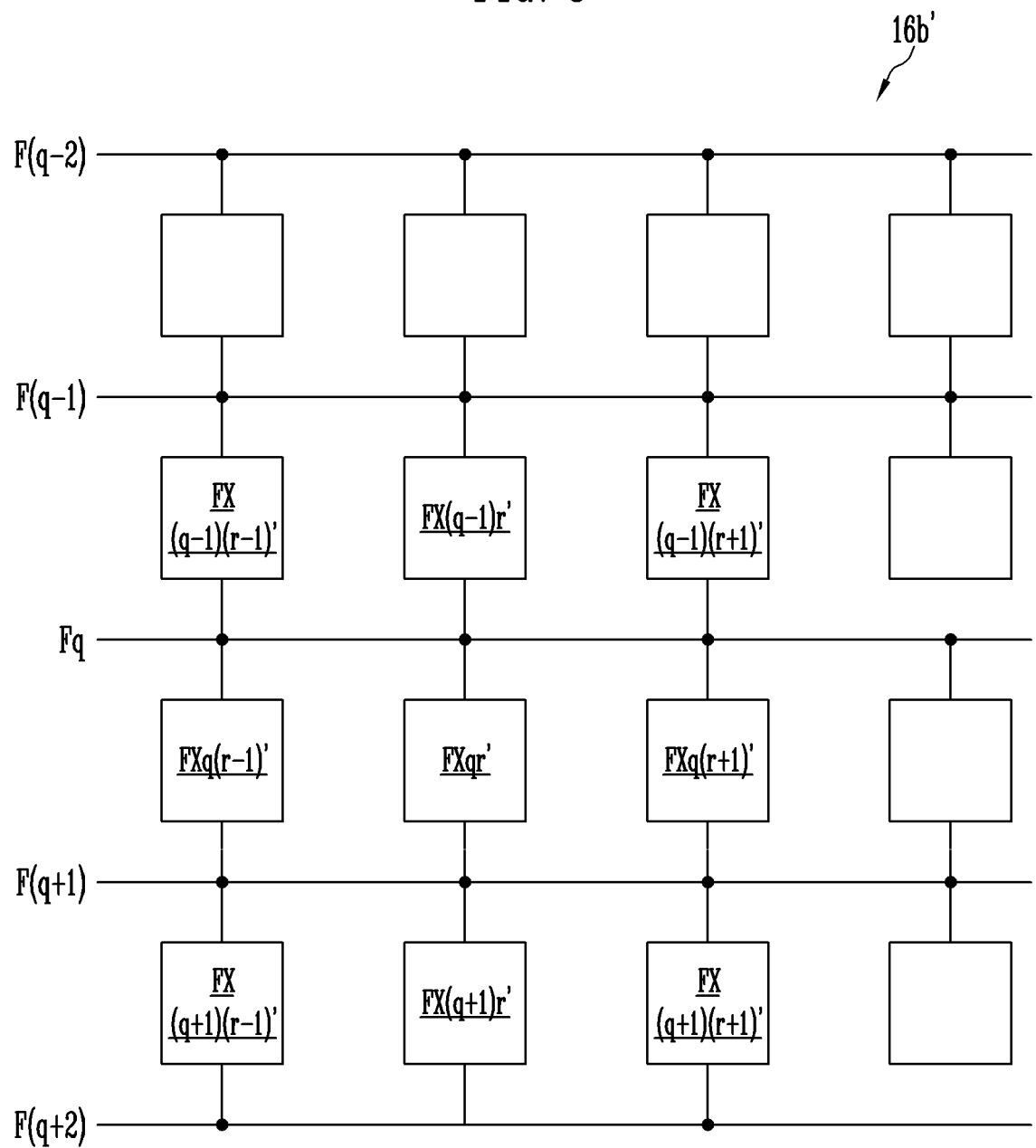
FIG. 8 is a diagram for explaining a display filter according to another embodiment of the invention.
Figure 9:
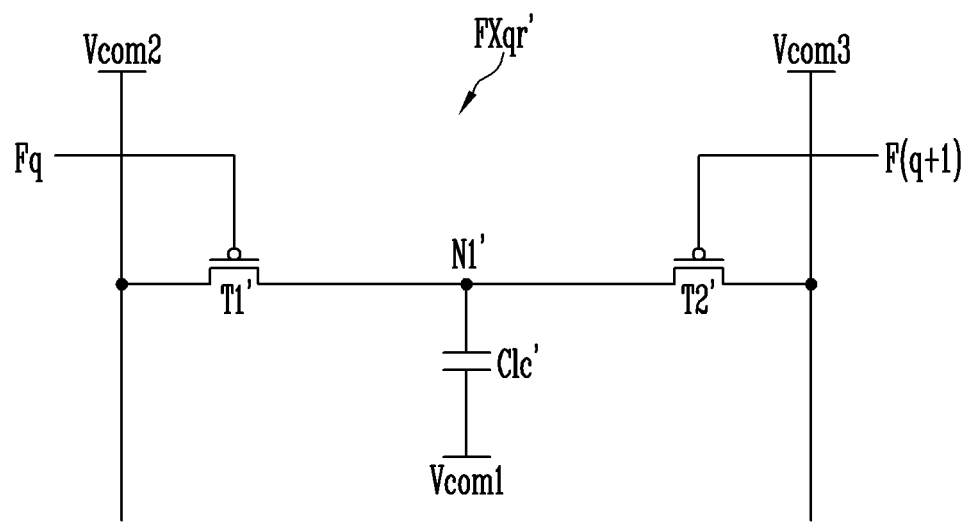
FIG. 9 is a circuit diagram for explaining a filter pixel according to another embodiment of the invention.

FIG. 8 is a diagram for explaining a display filter according to another embodiment of the invention. FIG. 9 is a circuit diagram for explaining a filter pixel according to another embodiment of the invention.

Referring to FIG. 8, a display filter 16b' may include the filter lines F(q−2) to F(q+2) and filter pixels FX(q−1)(r−1)' to FX(q+1)(r+1)'.

In this embodiment, filter pixels located in the same row may be connected to the same filter lines. For example, the filter pixels FXq(r−1)', FXqr', and FXq(r+1)' may be located in the same q-th row and the filter pixels FXq(r−1)', FXqr', and FXq(r+1)' may be connected to the same filter lines Fq and F(q+1).

Referring to FIG. 9, the filter pixel FXqr' may include a first transistor T1', a second transistor T2', and a liquid crystal capacitor Clc'.

The liquid crystal capacitor Clc' may have one electrode connected to the first common electrode Vcom1 and the other electrode connected to a first node N1'. A dielectric layer of the liquid crystal capacitor Clc' may be a liquid crystal layer.

The first transistor T1' may have a gate electrode connected to the first filter line Fq, one electrode connected to the second common electrode Vcom2, and the other electrode connected to the first node N1'.

The second transistor T2' may have a gate electrode connected to the second filter line F(q+1), one electrode connected to a third common electrode Vcom3, and the other electrode connected to the first node N1'.

A first DC voltage may be supplied to the first common electrode Vcom1 during each of a plurality of frames including one frame and a second DC voltage may be supplied to the second common electrode Vcom2 during each of the plurality of frames. In addition, a third DC voltage may be supplied to the third common electrode Vcom3 during each of the plurality of frames.

In one embodiment, the magnitudes (levels) of the second DC voltage and the third DC voltage may be different from each other. For example, one of the second DC voltage and the third DC voltage may have the same magnitude as the first DC voltage. A case where the third DC voltage has the same magnitude as the first DC voltage will be described herein, but embodiments of the present disclosure are not limited thereto.

Referring to FIGS. 7 and 9, when a voltage difference between the first DC voltage and the second DC voltage is generated at both ends of the liquid crystal capacitor Clc' as described above, an electric field may be generated, and the filter pixel FXqr' may be in a transmissive state or a non-transmissive state.

In this embodiment, the first DC voltage and the third DC voltage may be supplied to both ends of the liquid crystal capacitor Clc', and since there is no voltage difference across the liquid crystal capacitor Clc', an electric field may not be generated. According to this embodiment, since the liquid crystal capacitor Clc' can be discharged faster than in the embodiment of FIG. 7, the switching speed between the transmissive state and the non-transmissive state of the filter pixel FXqr' can be accelerated.

Figure 10:
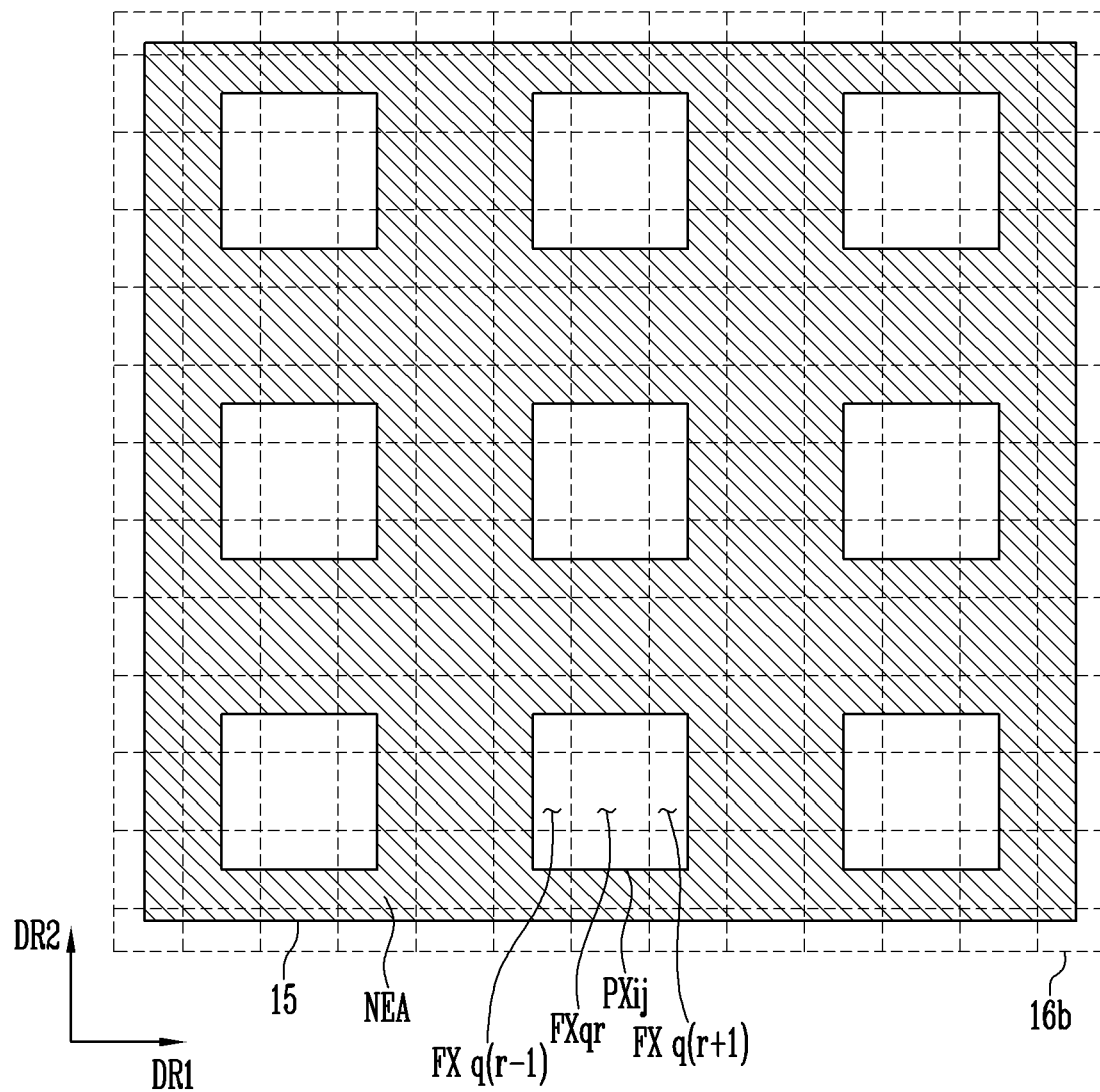
FIGS. 10 and 11 are diagrams for explaining the relationship between a display filter and a display panel according to an embodiment of the invention.
Figure 11:
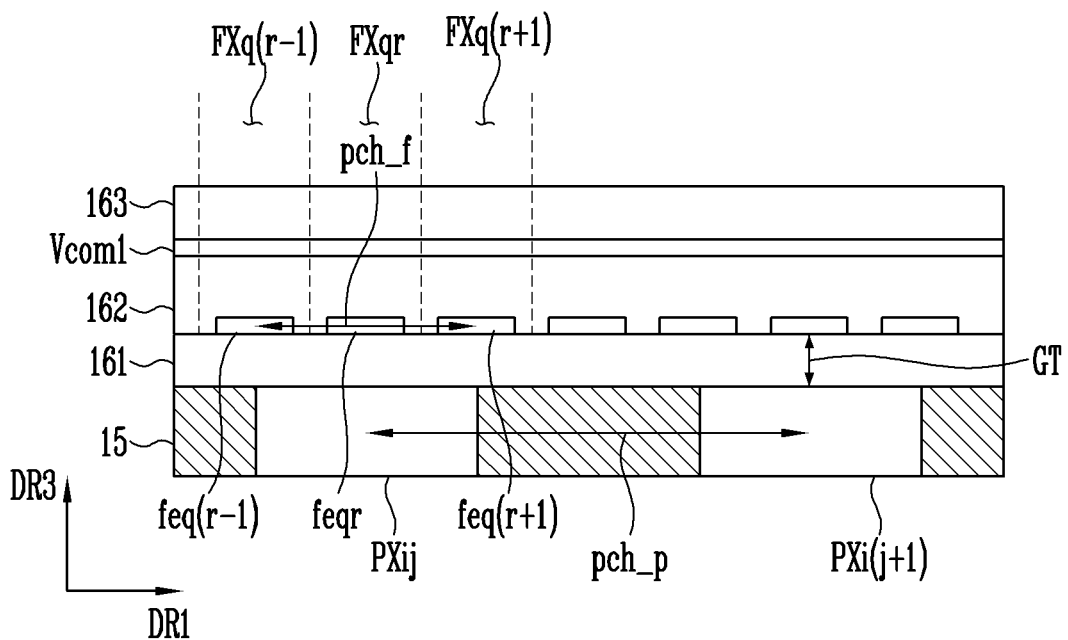

FIGS. 10 and 11 are diagrams for explaining the relationship between a display filter and a display panel according to an embodiment of the present invention.

The display filter 16b may include a larger number of filter pixels FXq(r−1), FXqr, FXq(r+1), etc. than the display pixels PXij, etc. For example, four or more filter pixels FXq(r−1), FXqr, FXq(r+1), etc. may overlap with one display pixel PXij. Although an embodiment has been described in which nine filter pixels FXq(r−1), FXqr, FXq(r+1), etc. overlap with one display pixel PXij, the number of overlapping filter pixels FXq(r−1), FXqr, FXq(r+1), etc. may vary in another embodiment. The area of each of the filter pixels FXq(r−1), FXqr, FXq(r+1), etc. may be smaller than the area of the display pixel PXij.

The display filter 16b may include a first substrate 161, a liquid crystal layer 162, and a second substrate 163.

The first substrate 161 may be disposed between the liquid crystal layer 162 and the display panel 15. The second substrate 163 may be disposed on the first substrate 161 and the liquid crystal layer 162. For example, the first substrate 161 and the second substrate 163 may cover the liquid crystal layer 162 to seal the liquid crystal layer 162.

In one embodiment, the first common electrode Vcom1 may be located on one side of the second substrate 163. Each of the filter pixels FXq(r−1), FXqr (or FXqr'), FXq(r+1), etc. may be defined by a corresponding one of the filter electrodes feq(r−1), feqr, feq(r+1), etc. Each of the filter electrodes feq(r−1), feqr, feq(r+1), etc. may be a conductor corresponding to the first node N1 (or N1') of each of the filter pixels. Each of the liquid crystal capacitors Clc (or Clc') may be composed of the filter electrodes feq(r−1), feqr and feq(r+1), etc., the first common electrode Vcom1, and the liquid crystal layer 162. In one embodiment, the corresponding filter electrodes feq(r−1), feqr, feq(r+1), etc. may be located on one side of the first substrate 161.

In the embodiment of FIG. 11, elements are shown based on the TN mode, the VA mode, and/or the like, but in the IPS mode, the FFS mode, and/or the like, the filter electrodes and the first common electrode may be located on the same substrate. In addition, a polarizing film may be disposed on at least one of the first substrate 161 and the second substrate 163.

Hereinafter, a case where the filter pixels FXq(r−1) and FXq(r+1) are in a transmissive state and the filter pixel FXqr is in a non-transmissive state will be described, but embodiments of the present disclosure are not limited thereto. At this time, diffracted light may be emitted through the filter pixels FXq(r−1) and FXq(r+1). A description of the diffracted light may be the same as the one provided in connection with FIG. 5.

Referring to Equation 1 below, an interval pch_f between the filter pixels FXq(r−1) and FXq(r+1) in the transmissive state may be determined by a thickness GT of the first substrate 161, a refractive index GN of the first substrate 161, an interval pch_p between the display pixels PXij and PXi(j+1), and a target wavelength WL.

$$\text{pch\_f} = \frac{WL}{GN} \times \frac{1}{\sin\left(\tan^{-1}\frac{\text{pch\_p}}{2GT}\right)}. \qquad \text{Equation 1}$$

The target wavelength WL may refer to a wavelength at which the non-light emitting area NEA of the display panel 15 is not visible. The target wavelength WL may be set to one of the wavelengths of the visible light band. For example, the target wavelength WL may be 656 nm so that the diffraction effect with respect to red light occurs well. In some embodiments, for example, the target wavelength WL may be 555 nm so that the diffraction effect with respect to green light occurs well. In some embodiments, for example, the target wavelength WL may be 454 nm so that the diffraction effect with respect to blue light occurs well.

The interval pch_f between the filter pixels FXq(r−1) and FXq(r+1) in the transmissive state may be the interval between the centers of the filter pixels FXq(r−1) and FXq(r+1), which is the nearest transmissive state, or the interval between the centers of the filter electrodes feq(r−1) and feq(r+1) of the filter pixels FXq(r−1) and FXq(r+1), which is the nearest transmissive state.

In some embodiments, the interval pch_p between the display pixels PXij and PXi(j+1) may be the interval between the centers of the most adjacent display pixels PXij and PXi(j+1).

Figure 12:
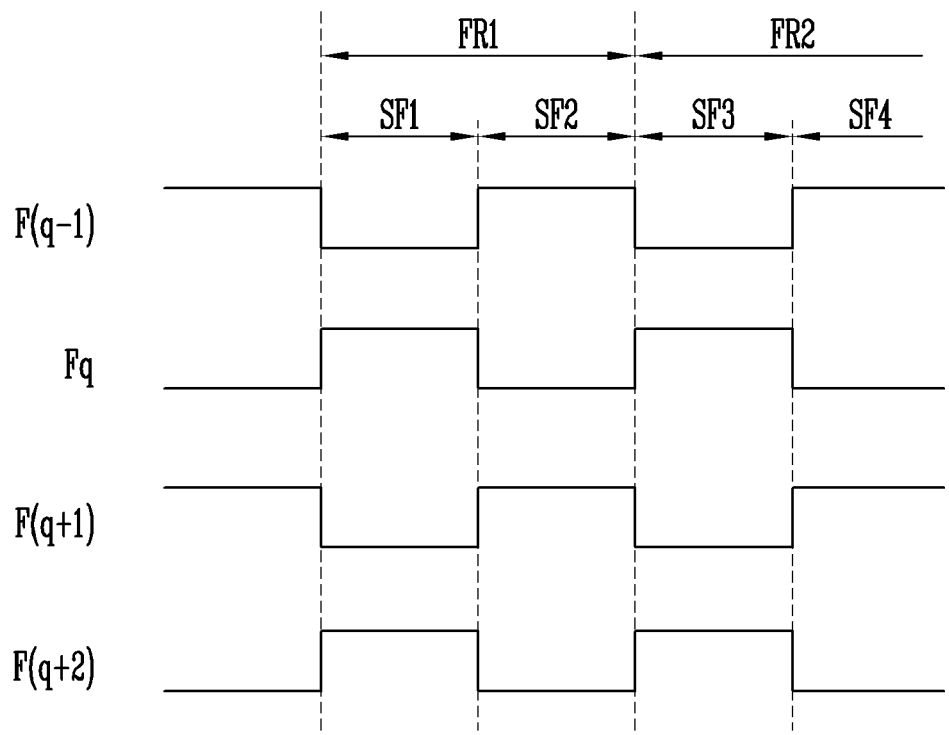
FIG. 12 is a timing chart for explaining a driving method of the display filter according to an embodiment of the invention.
Figure 13:
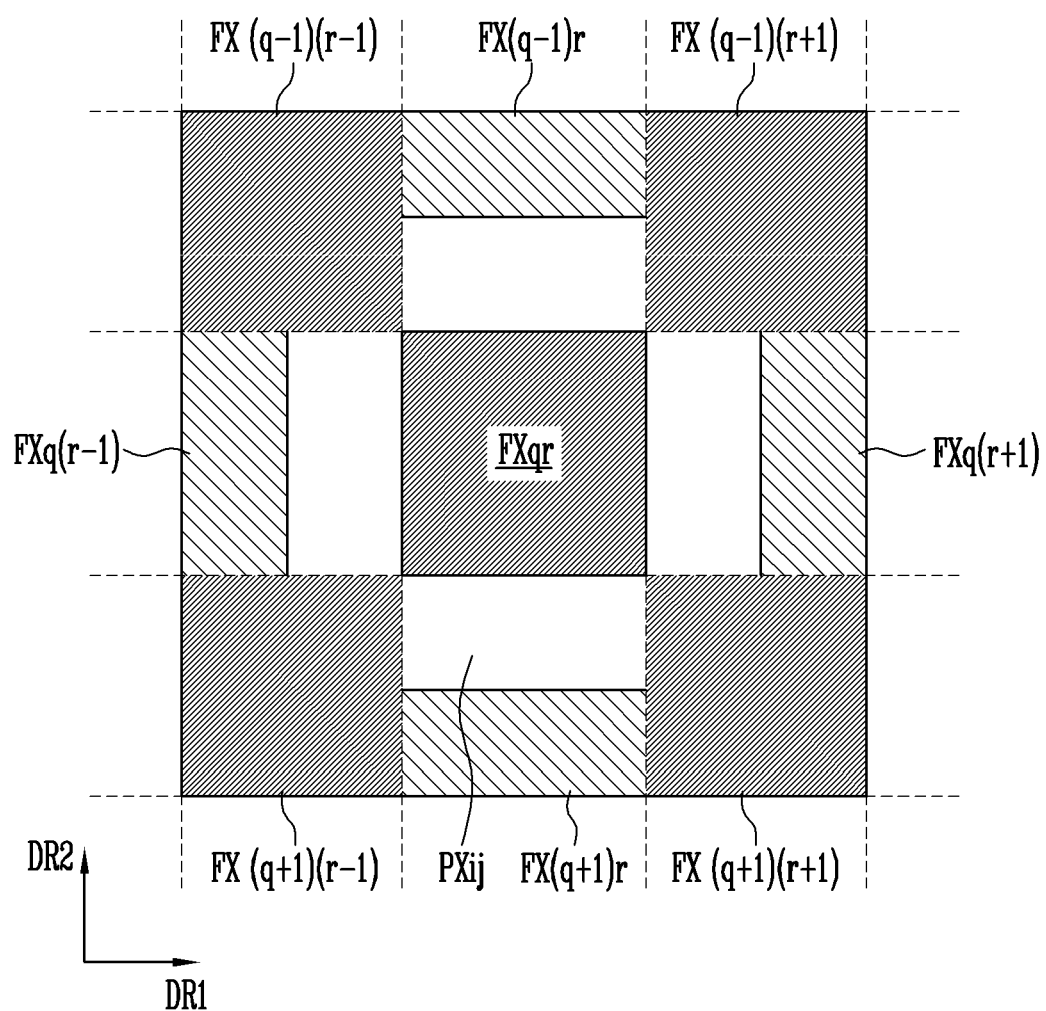
FIGS. 13 and 14 are diagrams for explaining a driving method of the display filter according to an embodiment of the invention.
Figure 14:
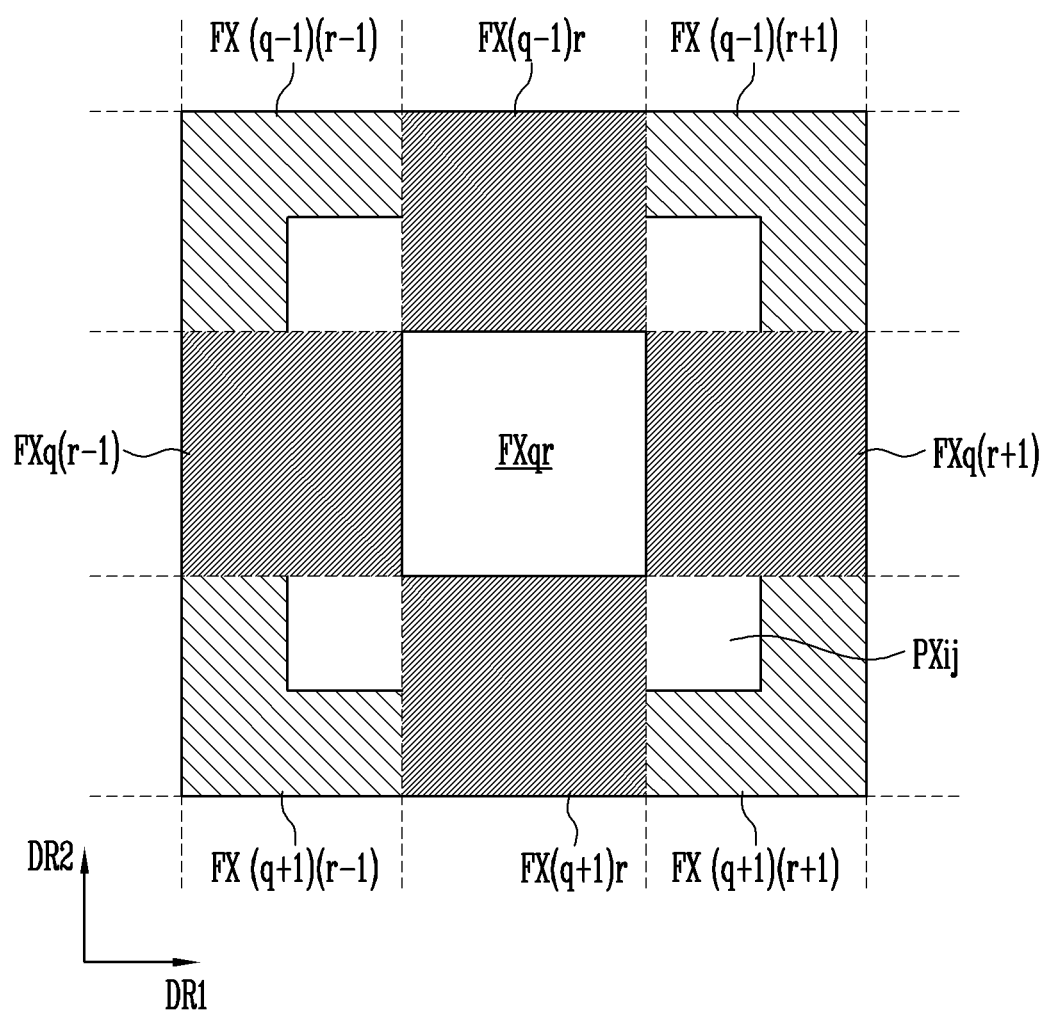

FIG. 12 is a timing chart for explaining a driving method of the display filter according to an embodiment of the invention. FIGS. 13 and 14 are diagrams for explaining a driving method of the display filter according to an embodiment of the invention.

Each of the display pixels according to the present embodiments may emit light with a luminance corresponding to one grayscale level in one frame unit. For example, an arbitrary display pixel may store a first data signal corresponding to a first gray level in a first frame FR1 and a second data signal corresponding to a second gray level in a second frame FR2. Therefore, the arbitrary display pixel may emit light with luminance corresponding to the first grayscale level in the first frame FR1 and emit light with luminance corresponding to the second grayscale level in the second frame FR2. The time point of generation of the turn-on level pulse of the scan signal for storing the data signal may be different for each of the scan lines. Thus, each frame period may be different for each scan line.

Each of the filter pixels according to the present embodiments may be switched to a transmissive state or a non-transmissive state in units of sub-frames each being shorter in period than a corresponding frame. Voltages of different magnitudes may be alternately supplied to a first group of filter lines Fq and F(q+2) and a second group of filter lines F(q−1) and F(q+1) in units of sub-frames.

Referring to FIGS. 12 and 13, for example, in a first sub-frame SF1, a filter signal of a turn-off level (high level voltage) may be supplied to the first group of filter lines Fq and F(q+2) and a filter signal of a turn-on level (low level voltage) may be supplied to the second group of filter lines F(q−1) and F(q+1). Assuming a normally white mode, in the first sub-frame SF1, filter pixels FX(q−1)(r−1), FX(q−1)(r+1), FXqr, FX(q+1)(r−1), and FX(q+1)(r+1), in which gate electrodes of the first transistors M1 are connected to the first group of filter lines Fq and F(q+2), become a non-transmissive state, and filter pixels FX(q−1)r, FXq(r−1), FXq(r+1), and FX(q+1)r, in which gate electrodes of the first transistors M1 are connected to the second group of filter lines F(q−1) and F(q+1), become a transmissive state. The same description may be applied to a third sub-frame SF3.

Referring to FIGS. 12 and 14, for example, in a second sub-frame SF2, a filter signal of a turn-on level may be supplied to the first group of filter lines Fq and F(q+2), and a filter signal of a turn-off level may be supplied to the second group of filter lines F(q−1) and F(q+1). Assuming a normally white mode, in the second sub-frame SF2, filter pixels FX(q−1)(r−1), FX(q−1)(r+1), FXqr, FX(q+1)(r−1), and FX(q+1)(r+1), in which gate electrodes of the first transistors M1 are connected to the first group of filter lines Fq and F(q+2), become a transmissive state, and filter pixels FX(q−1)r, FXq(r−1), FXq(r+1), and FX(q+1)r, in which gate electrodes of the first transistors M1 are connected to the second group of filter lines F(q−1) and F(q+1), become a non-transmissive state. The same description may be applied to a fourth sub-frame SF4.

The positions of the filter pixels FX(q−1)r, FXq(r−1), FXq(r+1), and FX(q+1)r overlapped with the display pixel PXij of the transmissive state in the first and third sub-frames SF1 and SF3 of FIG. 13 may correspond to the positions of the holes hl1, hl2, etc. overlapped with the display pixel PXij of FIG. 4. Therefore, according to this embodiment, similarly to FIG. 4, the black net shape due to the non-light emitting area NEA can be prevented or reduced from being visible to the user.

However, according to embodiments of the present disclosure, unlike the fixed holes of FIG. 4, the moiré phenomenon can be prevented or reduced by changing the positions of the filter pixels FX(q−1)(r−1), FX(q−1)(r+1), FXqr, FX(q+1)(r−1), and FX(q+1)(r+1), which are in the transmission state in the second and fourth sub-frames SF2 and SF4, as shown in FIG. 14. According to the present embodiments, in the second and fourth sub-frames SF2 and SF4, the interval (pch_f) between the filter pixels FX(q−1)(r−1), FX(q−1)(r+1), FXqr, FX(q+1)(r−1), and FX(q+1)(r+1) in the transmissive state may be maintained (refer to the description of Equation 1), so that the black net shape in the non-light emitting area NEA with respect to an object wavelength WL may be prevented or reduced from being viewed by the user.

Figure 15:
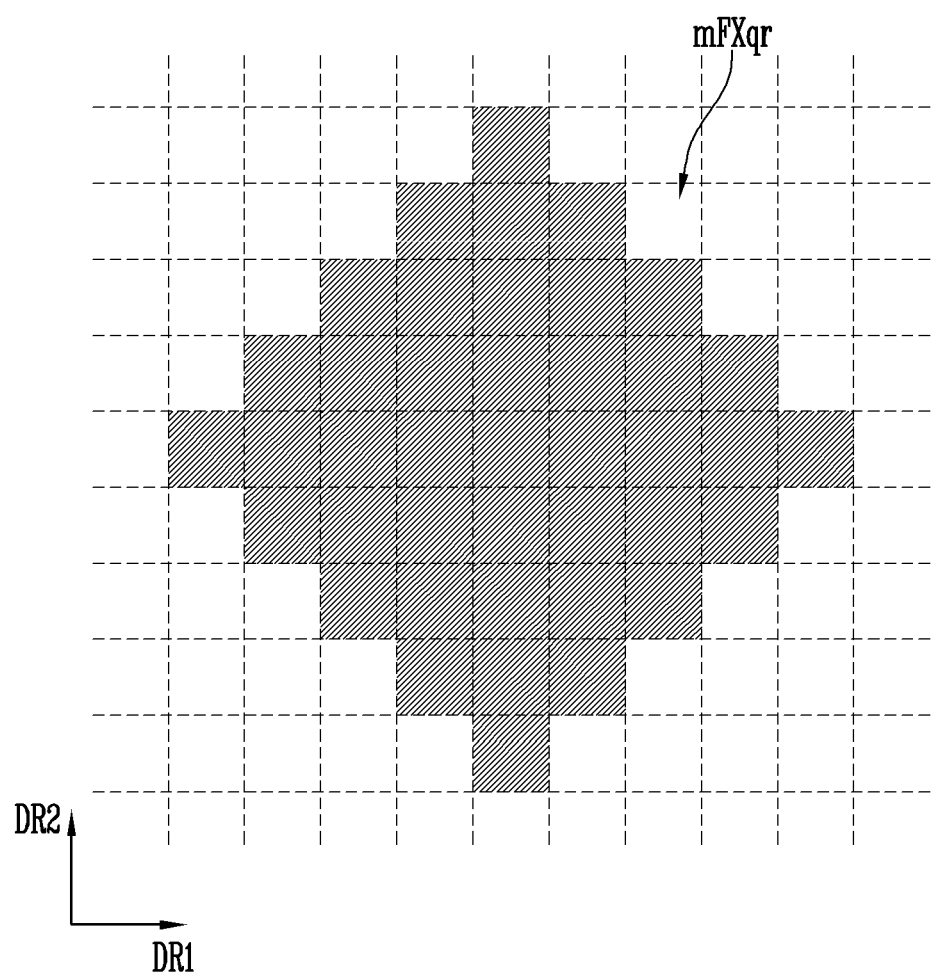
FIG. 15 is a diagram for explaining a display filter according to another embodiment of the invention.

FIG. 15 is a diagram for explaining a display filter according to another embodiment of the present invention.

Referring to FIG. 15, a case where a plurality of sub-filter pixels constitute one filter pixel mFXqr has been shown by way of an example. The plurality of sub-filter pixels constituting the filter pixel mFXqr may be in the transmissive state at the same time or may be in the non-transmissive state at the same time. FIG. 15 shows the case where the filter pixel mFXqr is in a non-transmissive state.

According to this embodiment, the filter pixel mFXqr may be in the form of a rhombus rather than a rectangle. However, in another embodiment, the shape and position of the filter pixel mFXqr may be determined in various ways, and the embodiments of the present disclosure are not limited thereto.

The display device according to embodiments of the present invention can prevent or reduce the non-light emitting area of the display panel from being visually recognized by a user, and can prevent or reduce the moiré phenomenon.

As used herein, the terms "use," "using," and "used" may be considered synonymous with the terms "utilize," "utilizing," and "utilized," respectively.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present. For example, when a first element is described as being "coupled" or "connected" to a second element, the first element may be directly coupled or connected to the second element or the first element may be indirectly coupled or connected to the second element via one or more intervening elements.

It will be further understood that the terms "comprises" and/or "comprising" used herein specify the presence of stated features or components, but do not preclude the presence or addition of one or more other features or components.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the [device] may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the [device] may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The drawings referred to heretofore and the detailed description of the invention described above are merely illustrative of the invention. It is to be understood that the invention has been disclosed for illustrative purposes only and is not intended to limit the scope of the invention. Therefore, those skilled in the art will appreciate that various modifications and equivalent embodiments are possible without departing from the scope of the invention. Accordingly, the true scope of the invention should be determined by the technical idea of the appended claims and equivalents thereof.

What is claimed is:

1. A display device comprising:
a display panel including display pixels; and
a display filter overlapping the display panel and comprising filter pixels, wherein the filter pixels are greater in number than the display pixels,
wherein each of the filter pixels comprises:
a liquid crystal capacitor having an electrode connected to a first common electrode and another electrode connected to a first node;
a first transistor having a gate electrode connected to a first filter line, an electrode connected to a second common electrode, and another electrode connected to the first node;
a second transistor having a gate electrode connected to a second filter line, an electrode connected to a third common electrode, and another electrode connected to the first node,
wherein a first DC voltage is supplied to the first common electrode during each of frames,
wherein a second DC voltage having a magnitude different from that of the first DC voltage is supplied to the second common electrode during each of the frames,
wherein in units of frames, each of the display pixels is configured to emit light at a luminance corresponding to a-grayscale level,
wherein in units of sub-frames, each of the filter pixels is configured to be switched to a transmissive state or a non-transmissive state,
wherein each of the sub-frames is shorter in period than a corresponding one of the frames, and
wherein each of the filter pixels is smaller in area than a corresponding one of the display pixels.

2. The display device of claim 1, wherein a third DC voltage having a magnitude different from that of the second DC voltage is supplied to the third common electrode during each of the frames.

3. The display device of claim 2, wherein voltages of different magnitudes are supplied to the first filter line and the second filter line during each of the frames.

4. The display device of claim 3, wherein in units of sub-frames, the voltages of the different magnitudes are alternately supplied to the first filter line and the second filter line.

5. The display device of claim 1, wherein the display filter further comprises:
a liquid crystal layer;
a first substrate between the liquid crystal layer and the display panel; and
a second substrate on the first substrate and the liquid crystal layer.

6. A display device comprising:
a display panel including display pixels and
a display filter overlapping the display panel and comprising filter pixels, wherein the filter pixels are greater in number than the display pixels,
wherein each of the filter pixels comprises:
a liquid crystal capacitor having an electrode connected to a first common electrode and another electrode connected to a first node; and
a first transistor having a gate electrode connected to a first filter line, an electrode connected to a second common electrode, and another electrode connected to the first node,
wherein the display filter further comprises:
a liquid crystal layer;
a first substrate between the liquid crystal layer and the display panel; and
a second substrate on the first substrate and the liquid crystal layer,
wherein in units of frames, each of the display pixels is configured to emit light at a luminance corresponding to a-grayscale level,
wherein in units of sub-frames, each of the filter pixels is configured to be switched to a transmissive state or a non-transmissive state,
wherein each of the sub-frames is shorter in period than a corresponding one of the frames,
wherein each of the filter pixels is smaller in area than a corresponding one of the display pixels, and
wherein an interval between the filter pixels in the transmissive state is set based on a thickness of the first substrate, a refractive index of the first substrate, an interval between the display pixels, and a target wavelength.

7. The display device of claim 6, wherein the interval (pch_f) between the filter pixels in the transmissive state is set to satisfy Equation 1:

$$\text{pch\_f} = \frac{WL}{GN} \times \frac{1}{\sin\left(\tan^{-1}\frac{\text{pch\_p}}{2GT}\right)}, \qquad \text{Equation 1}$$

wherein GT is the thickness of the first substrate, GN is the refractive index of the first substrate, pch_p is the interval between the display pixels, and WL is the target wavelength.

8. The display device of claim 6, wherein a first group of the filter pixels and a second group of the filter pixels overlap a corresponding one of the display pixels, and
when the first group of the filter pixels is in the transmissive state, the second group of the filter pixels is in the non-transmissive state.

9. The display device of claim 8, wherein when the first group of the filter pixels is in the non-transmissive state, the second group of the filter pixels is in the transmissive state.

* * * * *